(12) United States Patent
Chang (10) Patent No.: US 6,981,233 B2
(45) Date of Patent: Dec. 27, 2005

(54) METHOD FOR ANALYZING PATH DELAYS IN AN IC CLOCK TREE

(75) Inventor: Jui-Ming Chang, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 344 days.

(21) Appl. No.: 10/373,327

(22) Filed: Feb. 24, 2003

(65) Prior Publication Data

US 2004/0168140 A1   Aug. 26, 2004

(51) Int. Cl.[7] .............................................. G06F 9/45
(52) U.S. Cl. ............................................. 716/6; 716/4
(58) Field of Search ...................... 716/6, 5, 4

(56) References Cited

U.S. PATENT DOCUMENTS

| | | | | |
|---|---|---|---|---|
| 5,883,808 | A | * | 3/1999 | Kawarabayashi ............... 716/2 |
| 5,963,728 | A | * | 10/1999 | Hathaway et al. .............. 716/3 |
| 6,073,246 | A | * | 6/2000 | Song et al. .................. 713/401 |
| 6,550,045 | B1 | * | 4/2003 | Lu et al. ......................... 716/6 |
| 6,574,781 | B1 | * | 6/2003 | Harada et al. ................... 716/5 |
| 6,701,507 | B1 | * | 3/2004 | Srinivasan .................... 716/10 |
| 6,763,513 | B1 | * | 7/2004 | Chang et al. .................. 716/14 |
| 6,782,519 | B2 | * | 8/2004 | Chang et al. ................... 716/6 |

* cited by examiner

Primary Examiner—Vuthe Siek
Assistant Examiner—Brandon Bowers
(74) Attorney, Agent, or Firm—Rosenberg, Klein & Lee (57) ABSTRACT

A macro-cell is incorporated into an integrated circuit (IC) design to describe a fixed arrangement of cells to be included in the IC. The IC includes a clock tree for delivering a clock signal from its root to all clocked devices (sinks) within the IC external to the macro-cell, and to a root of a clock tree subtree included within the macro-cell for delivering the clock signal from its root to sinks residing within the macro-cell. A model of the subtree depicts the maximum and minimum delays of the clock signal's rising and falling edges between the subtree root and the sinks within the macro-cell as functions of the clock signal's rising and falling edge transition times as they arrives at the subtree root and also as functions of the relative amount of delay the rising and falling edges experience as they pass from the clock tree root to the subtree root. A clock tree synthesis tool uses the subtree model to determine the maximum and minimum rising and falling edge path delays though the subtree when estimating the maximum and minimum amounts by which the clock tree delays the clock signal's rising and falling edges as they pass from the clock tree root to any sink of the IC.

19 Claims, 4 Drawing Sheets

METHOD FOR ANALYZING PATH DELAYS IN AN IC CLOCK TREE

BACKGROUND OF THE INVENTION

1. Field of the Invention

The present invention relates in general to tools for clock trees for distributing clock signals within integrated circuit (ICs) and in particular to a method for estimating path delays in a clock tree having an independently designed subtree.

2. Description of Related Art

A netlist describes an integrated circuit (IC) by listing instances of standard circuit components ("cells") such as gates and transistors that are to be included in the IC, referencing the nets (signal paths) that convey signals between the cell instances, and indicating which cell instance terminals are to be connected to each net. An automated placement and routing (P&R) tool processes a netlist to produce a placement plan indicating where each cell instance is to be positioned within an IC die and a routing plan indicating how the nets interconnecting the cell instance terminals are to be routed through the various metal layers of the die.

Since the time a P&R tool needs to generate an acceptable placement and routing plan increases rapidly with the number of cell instances to be placed, one way to reduce processing time is to reduce the number of cells that must be placed, and one way to do that is incorporate large "macro-cells" into the IC design. A macro-cell describes the layout of a relatively large block of IC logic formed by many smaller cell instances. For example a design for an IC including an embedded random access memory (RAM) usually employs an instance of a macro-cell to implement the RAM. Since the layout for cells forming a macro-cell is predetermined, when a P&R tool lays out an IC incorporating an instance of a macro-cell, it need only incorporate the pre-determined macro-cell layout into an area of the die reserved for the macro-cell and then route nets between the terminals of the macro-cell and other cells of the IC. It need not determine how to place and route the individual cells forming the macro-cell.

Figures 1, 2, 3, 4, 5:
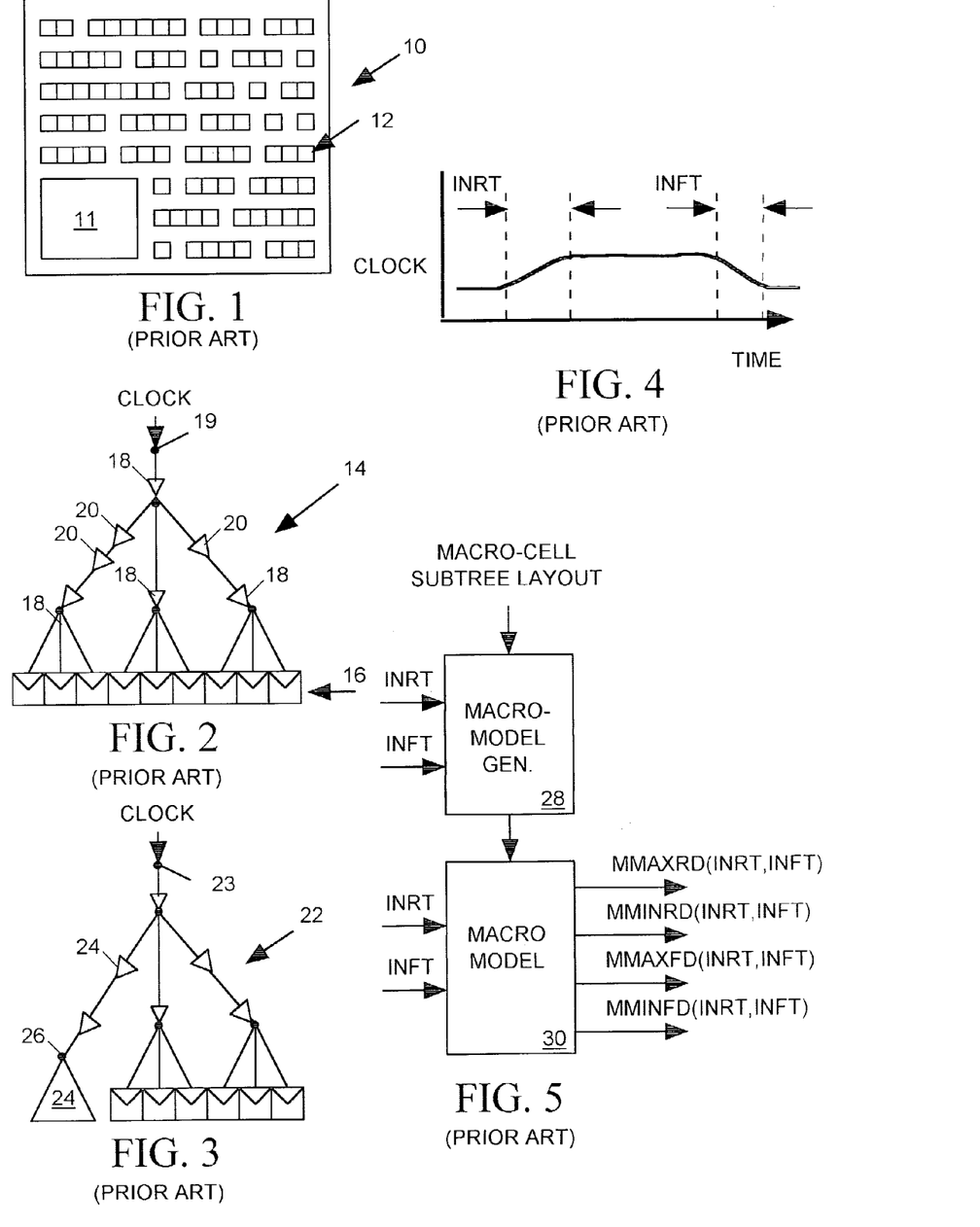
FIG. 1 is a simplified plan view of a prior art IC layout.
FIGS. 2 and 3 are simplified block diagrams of prior art clock trees.
FIG. 4 is a timing diagram illustrating time-varying behavior of a clock signal.
FIG. 5 is a block diagram illustrating a prior art macro model generator generating a macro model representing maximum and minimum clock signal edge delays though a clock tree described by a macro-cell.

FIG. 1 illustrates an example of an IC layout 10 incorporating an instance of a macro-cell 11 and a set of cell instances 12 forming portions of the IC not implemented by the macro-cell. Although for simplicity, FIG. 1 shows the IC as having only one macro-cell instance and a relatively small number of cell instances 12, a typical IC design may employ more than one macro-cell and a much larger number of cell instances.

While the use of larger macro-cells to implement large blocks of logic in an IC can reduce the time needed to generate a layout, complications arise when a macro-cell implements logic that must be synchronized to logic implemented by cells outside the macro-cells. Various blocks of logic in a synchronous logic circuit transmit logic signals to one another via clocked devices ("sinks") such as registers, latches and flip-flops so that the signals each logic block transmits and receives change state only in response to edges of the clock signals that clock the sinks. This ensures that state changes in the signals various logic blocks use to communicate with each other occur at predictable times so that the logic operations of those logic blocks are synchronized.

The sinks are clocked by edges of the clock signals, and to ensure that all signals passing though sinks change state at substantially the same time, it is necessary to ensure that clock signal edges arrive at the sinks with a timing variation (skew) that is within some small, predetermined limit. An external clock signal generator typically supplies a clock signal as input to an terminal of the IC that is connected to a root of a "clock tree", a branching network for distributing the clock signal from its root to all sinks within the IC that are clocked by edges of that clock signal. FIG. 2 depicts a simple clock tree 14 for delivering a clock signal arriving at a node A to several sinks 16. Clock tree 14 includes a set of buffers and/or inverters 18 for providing the power needed to fan out the clock signal at the clock tree's branch nodes. Additional buffers 20 are inserted into various branches of clock tree 14 to adjust the path delays so that clock signal edges arrive at all sinks 16 at the same time. Although for simplicity clock tree 12 is depicted as having only two branching levels and supplying a clock signal to only nine sinks 16, clock trees frequently have many more branching levels and can supply clock signals to thousands of sinks.

While a typical netlist initially lists the cell instances forming the logic of an IC, it does not list instances of buffer and inverter cells forming a clock tree because the clock tree can be designed (synthesized) only after a P&R tool has generated an IC layout indicating positions within the die of all of sinks 16 that are to receive the clock signal. At that point the P&R tool can employ a clock tree synthesis (CTS) tool to synthesize a separate clock tree for each of the IC's clock signals. A CTS tool typically tries to position the buffers 18 at a clock tree's branching nodes so that the clock signal travels approximately the same distance from the clock tree's root 19 to each sink 16, but that alone will usually not keep clock signal skew within acceptable limits. Thus a CTS tool will also insert one or more buffers or inverters 20 into various branches of the clock tree as necessary to balance the path delays between clock tree root 19 and sinks 16. The path delay through any branch of the clock tree is a function of the amount of time the clock signal needs to charge the inherent capacitance of the conductors forming the branch when changing state. A buffer or inverter 20 inserted into a clock tree branch can reduce the path delay through the branch by providing additional current for charging path capacitance more quickly. A CTS tool can finely adjust path delays by appropriately choosing the size, number and positions of buffers or inverters in each branch of the clock tree.

A macro-cell implementing synchronous logic must include an internal clock tree for delivering a clock signal to its sinks. Since the internal layout of the macro-cell is fixed, it is not necessary for a clock tree synthesis tool to generate a clock tree for the macro-cell. However when sinks both inside and outside of the macro-cell are to be clocked by the same clock signal, then the CTS tool that synthesizes a clock tree for the portion of the IC external to the macro-cell, must link the root of the macro-cell's internal clock tree to the synthesized clock tree so that sinks both inside and outside the macro-cell receive that clock signal. The clock tree within the macro-cell therefore becomes a "subtree" of a larger IC clock tree, and it is necessary for the CTS tool to take path delays through the subtree into account when balancing the larger clock tree.

For example FIG. 3 depicts a clock tree 22 for an IC in which a macro-cell instance provides its own internal subtree 24. Since the layout of subtree 24 within the macro-cell instance is fixed, the CTS tool must design the remaining portions of clock tree 22 to account for the clock signal path delays through subtree 24 to ensure that sinks inside and outside the macro-cell receive clock signal edges concurrently.

To determine how to place and size buffers and/or inverters 25 so as to properly balance clock tree 22, the CTS tool must be able to estimate path delays through all branches of clock tree 22 outside the macro-cell. These path delays depend on impedances of the conductors forming each branch of the clock tree and on impedances and switching speeds of buffers or inverters 25. A resistance/capacitance (RC) extraction tool can analyze a clock tree layout to determine path impedances. A CTS tool uses that information, together with information it obtains from a cell library regarding the impedances and switching speeds of the buffers and inverters, to estimate the clock signal rising and falling edge path delays from the root 23 of the clock tree to each node of the clock tree outside of subtree 24. The CTS tool must also be able to estimate the path delays between the root 26 of subtree 24 and the sinks within the macro-cell, but since the layout of subtree 24 is fixed, the CTS really need only be able to determine the maximum and minimum possible rising and falling edge delays between subtree root 26 and the sinks within the macro-cell served by that subtree. The CTS tool could estimate path delays within subtree 24 in the same way it estimates path delays outside the subtree, based on path and buffer impedances and switching delays. But since the CTS tool cannot alter subtree 24, it is not necessary for the CTS tool to know the path delay through each branch of subtree 24. To balance clock tree 22, it is only necessary for the CTS tool to know only the maximum and minimum rising and falling edge delays between subtree root 26 and any sink served by the subtree.

Thus a macro-cell designer may provide an IC design not only with the macro-cell design, but also with a model of each clock tree within the macro-cell indicating the maximum and minimum rising and falling clock signal edge delays through the subtree. When the IC designer thereafter incorporates an instance of the macro-cell into an IC layout, a CTS tool synthesizing a clock tree for the entire IC need only consult the model for the macro-cell's subtree to obtain the information it needs regarding maximum and minimum clock signal path delays through the subtree determining how to balance the clock tree.

As illustrated in FIG. 4, a falling clock signal edge requires some amount of time (INFT) to fall high to low, and some amount of time (INRT) to rise from low to high, and macro-cell designers know that path delays through a macro-cell's clock tree are not fixed but depend to some extent on the transition times of the clock signal's rising and falling edges as they arrive at the subtree's root. The rising and falling edge transition times INRT and INFT for a clock signal at any node of clock tree 22 are in turn functions of the impedances and switching characteristics of the conductors and buffers that deliver the clock signal to that node. When the maximum and minimum rising and falling edge delays though subtree 24 as indicated by the subtree model are estimated based on particular values of INRT and INFT, then when clock tree 22 delivers a clock signal to subtree root 26 that happens to exhibit other INRT and INFT values, the subtree model will provide the CTS tool with an inaccurate estimate of maximum and minimum rising and falling delays though subtree 24.

Referring to FIG. 5, to address this problem, a prior art macro model generator 28 processes the subtree layout to determine the maximum and minimum rising and falling edge delays (respectively) through the subtree for each of several different combinations of INRT and INFT. The results are then incorporated into a macro model 30, suitably a simple lookup table for reading out values of MMAXRD, MMINRD, MMAXFD, and MMINFD as functions of INRT and INFT. When a CTS tool thereafter estimates rising and falling edge path delays INRD and INFD to each node of clock tree 22 of FIG. 3, based on characteristics of the clock signal path leading to that node, it also estimates the values of INFT and INRT at each node of the clock tree. Then when the CTS tool needs to know the maximum and minimum rising and falling edge path delays from subtree root 26 to any sink served by subtree 24, it can use the computed values of INFT and INRT at the subtree root as inputs to the macro model 30 for subtree 26. The macro model then returns values of MMAXRD, MMINRD, MMAXFD, and MMINFD that are appropriate for the INFT and INRT values for the clock signal at the root of subtree 24.

This type of prior art macro model has been useful, but with increasing IC size and clock signal frequency, large discrepancies have begun to arise between the values of MMAXRD, MMINRD, MMAXFD, and MMINFD for a subtree that a macro model predicts for given values of INFT and INRT and the actual values of MMAXRD, MMINRD, MMAXFD, and MMINFD the subtree exhibits when placed in an IC. The errors arise because the rising and falling edge transition times INFT and INRT for the clock signal at the root of the subtree are not the only aspects of the clock signal that can substantially affect path delays through the subtree.

BRIEF SUMMARY OF THE INVENTION

A macro-cell describes an arrangement of cells that may be incorporated into an integrated circuit (IC) design and that may include a set of clocked devices (sinks) and a clock tree subtree for delivering a clock signal to the sinks. It is known that the maximum and minimum amount of time a clock signal's rising and falling edges require to travel from a root of the subtree to any sink receiving the clock signal via the subtree are not only functions of the characteristics of the conductors and active devices forming the subtree, but are also functions of the clock signal's rising and falling edge transition times at the subtree root. Thus like prior art prior clock subtree models, a subtree model in accordance with the invention depicts the maximum and minimum delays between the root of a subtree and the sinks connected to the subtree as functions of the transition times of the rising and falling edges of the clock signal as it arrives at the root of the subtree.

However the maximum and minimum clock signal rising and falling edge delays through the subtree are also functions of a difference in amount of delay the clock signal's rising and falling edges experience as they pass from a root of a clock tree to the root of the subtree. Delaying the rising and falling edges of a clock signal by differing amounts alters the duty cycle of a clock signal as it arrives at the root of the subtree, and the duty cycle of the clock signal at the root of a subtree can affect the amount of time clock signal edges require to pass though the subtree.

Thus in accordance with the invention, a model of a subtree represents maximum and minimum rising and falling edge path delays through the subtree as functions not only of the clock signal's rising and falling edge transition times at the root of the clock tree, but also as functions of relative amount of path delay the clock signal's rising and falling edges experience as they pass from the root of a clock tree to the root of the subtree.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to software stored on computer readable media which when read and executed by a conventional computer, causes the computer to design a clock tree for an integrated circuit (IC). Suitable computer-readable media for storing software include, but are not limited to, compact disks, floppy disks, hard disks, and random access or read only memory. While the specification describes at least one exemplary embodiment of the invention considered to be a best mode of practicing the invention, the invention is not limited to the exemplary embodiment(s) described below or to the manner in which the exemplary embodiments operate.

In an IC implementing synchronous logic, a clock tree distributes a clock signal to many devices (sinks) within an IC such as registers, latches and flip-flops that are clocked by the clock signal. FIG. 2 depicts a simple clock tree 14 for delivering a clock signal arriving at its root 19 to several sinks 16 through a set of buffers and/or inverters 18 provided to fan out the clock signal. A computer-aided clock tree synthesis (CTS) tool that designs (synthesizes) a clock tree tries to position the clock tree's buffers or inverters 18 to equalize path distances between the clock tree's root 19 and all sinks 16 to help ensure that clock signal edges will arrive at all sinks 16 at substantially the same time. Where necessary, the CTS tool will insert additional buffers or inverters 20 into various branches of the clock tree to finely balance path delays.

The invention relates to a method a CTS tool may employ to estimate path delays within a clock tree it has synthesized. This information enables the CTS tool to determine whether the clock tree is sufficiently well balanced, and if not, to determine where to insert additional buffers or inverters 20 and how to adjust their size so as to improve clock tree balance. As illustrated in FIG. 1, an IC 10 is typically formed by a set of interconnected instances 12 of standard circuit components (cells), and one or more macro-cell instances 11 which themselves are formed by many smaller instances cells. Large macro-cells 11 are usually positioned in areas of a semiconductor die reserved for them by a floor plan provided by a design engineer, and an automated placement and routing (P&R) tool usually determines how to arrange cell instances 12 in the aries of the die not otherwise reserved for macro-cells. Since the internal layout for macro-cell 11 is fixed, a P&R tool need not concern itself with the internal arrangement of the macro-cell 11, but it does have to determine how to route connections between the macro-cell input/output (I/O) terminals at the periphery of the macro-cell and other cell instances 11 external to the macro-cell.

After a P&R tool develops a layout for an IC wherein positions of all sinks requiring a clock signal are known, the P&R tool employs a CTS tool to synthesize a clock tree for delivering the clock signal to those sinks. When macro-cell 11 includes internal sinks, it will also include its own internal clock tree, and when sinks both inside and outside macro-cell 11 are to be clocked by the same clock signal, the macro-cell's clock tree becomes a subtree of the clock tree for the entire IC. For example, as illustrated in FIG. 3, a clock tree 24 within a macro-cell acts as a subtree of a clock tree 22 that delivers a clock signal to all sinks within an IC. A CTS tool synthesizes a balanced subtree within macro-cell 11, at the time the macro-cell is designed, so that the subtree will deliver clock edges from its root 26 to sinks within the macro-cell with an acceptably small timing variation (skew) from sink-to-sink. When an instance of that macro-cell is thereafter incorporated into an IC design, the CTS tool that synthesizes the portion of the clock tree outside the macro-cell, must insert buffers 24 into various branches of the clock tree to adjust path delays so as to synchronize arrival of clock signal edges at all sinks both inside and outside the macro-cell.

To balance such a clock tree, a CTS tool in accordance with the invention first estimates path delays through branches of clock tree 22 outside the macro-cell. These path delays depend on impedances of the conductors forming each branch and on impedances and switching speeds of buffers or inverters 24 in the various branches of the clock tree. A conventional resistance/capacitance (RC) extraction tool analyzes a clock tree layout to determine path impedances, and the CTS tool uses that information, together with information it obtains from a cell library regarding the impedances and switching speeds of buffers and inverters 24, to estimate path delays between the root 23 of clock tree 22 and every node of the clock tree external to subtree 24, including branching nodes and nodes at sink inputs.

Figure 6:
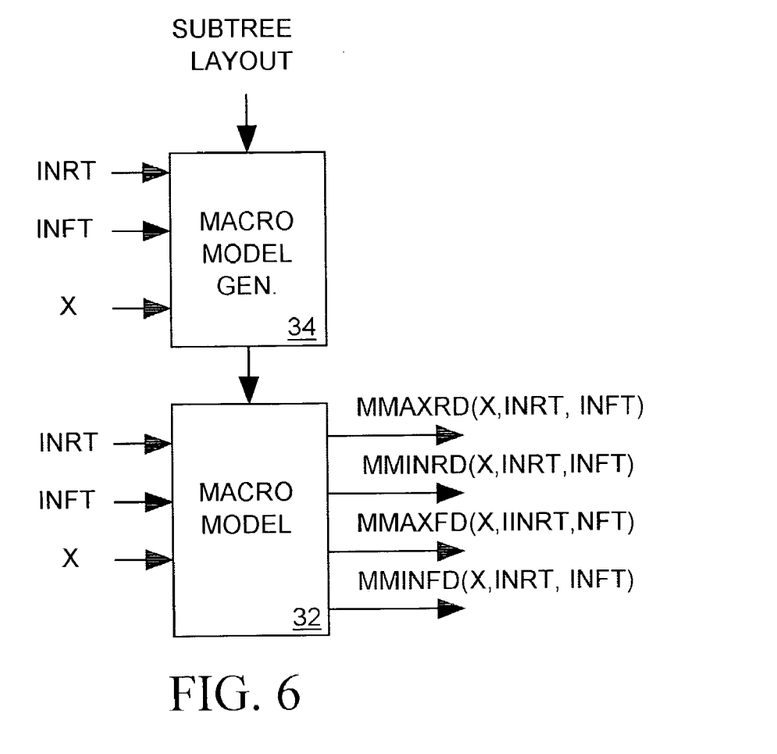
FIG. 6 is a block diagram illustrating a macro model generator in accordance with the invention generating a macro model representing maximum and minimum clock signal edge delays though a clock tree described by a macro-cell.

The CTS tool must also determine the maximum and minimum rising and falling edge path delays between the root 26 of subtree 24 and the sinks that it serves. To obtain that information, the CTS tool consults a "macro model" of the clock tree in accordance with the invention that can be created at the time the macro-cell is designed and thereafter provided to IC designers seeking to incorporate the macro-cell into their IC designs. As illustrated in FIG. 6, the subtree macro model is essentially a lookup table that returns values of the following variables:

MMAXRD(X,INRT,INFT): the maximum rising edge delay from the root of the subtree to any sink connected to that subtree, MMINRD(X,INRT,INFT): the minimum rising edge delay from the root of the subtree to any sink connected to that subtree, MMAXFD(X,INRT,INFT): the maximum falling edge delay from the root of the subtree to any sink connected to that subtree, and MMINFD(X,INRT,INFT): the minimum falling edge delay from the root of the subtree to any sink connected to that subtree.

Figure 7:
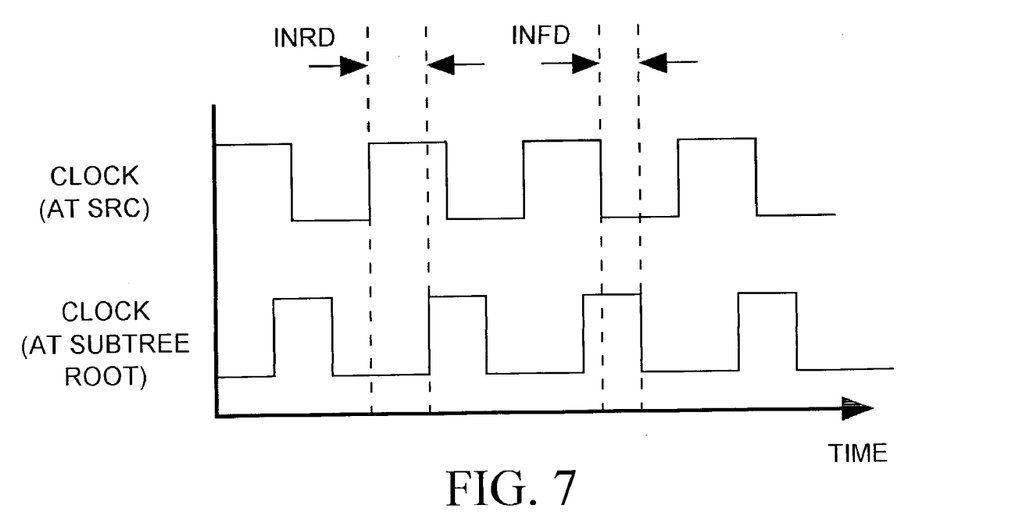
FIG. 7 is a timing diagram showing timing relationships between edges of a clock signal at the root of a clock tree and the root of a subtree of the clock tree.

The dependent variables MMAXRD, MMINRD, MMAXFD and MMINRD are functions of a set of three independent variables X, INRT and INFT that are best understood with reference to FIGS. 4 and 7. Variables INRT and INRT, respectively, are the clock signal's rising and falling edge transition times at the root of the subtree being modeled. In the preferred embodiment of the invention, the variable X is suitably defined as follows:

$$X=INRD-INFD$$

where INRD and INFD are the clock signal's rising and falling edge path delays between the root 23 of the clock tree (FIG. 3) and the root 26 of the subtree.

FIG. 7 compares the timing of rising and falling edges clock signal edges arriving at clock tree root 23 (FIG. 3) to the timing of the clock signal edges as they arrive at the root 26 of subtree 24. (For simplicity, FIG. 7 depicts clock signal edges as being abrupt, though in practice the clock signal edges will transition with some non-zero rising and falling edge transition times INFT and INRT as illustrated in FIG. 4.) In the example of FIG. 7, the path delay INRD between the clock tree root 23 and the root 26 of subtree 24 for rising edges of the clock signal is larger than the path delay INFD for falling edges of the clock signal, though INFD can be larger than INRD. The difference X between INRD and INFD, which may be positive or negative, arises mainly because the switching speed of buffers and inverters in the signal path is usually not symmetric with respect to driving a clock signal high and low. As may be seen from FIG. 7, a difference between INRD and INFD has the effect of altering the duty cycle of the clock signal arriving at the root of the subtree. In the example of FIG. 7, the clock signal has a 50% duty cycle at the root 23 of the clock tree, but by the time it arrives at the root 26 of subtree 24, it has somewhat less than a 50% duty cycle.

The rising and falling edge path delays through a subtree within a macro-cell depend not only of the rising and falling edge transition times INRT and INFT of the clock signal arriving at the root of the subtree, but also on the duty cycle of the clock signal at the root of the subtree, a monotonic function of X. Since X tends to vary with the number of buffers or inverters in the signal path between roots 23 and 26, the value of X, and therefor the duty cycle of the clock signal at the root 26 of the subtree, can vary depending on the nature of the signal path the CLOCK signal follows on its way to the subtree. Thus the value of X= INRD–INFD of the clock signal as it arrives at a subtree, can affect path delays within the subtree.

Therefore, in accordance with the invention, a macro model generator 34 (FIG. 6) analyzes the subtree layout within the macro model to determine values of MMAXRD, MMINRD, MMAXFD and MMINRD when the subtree receives a clock signal exhibiting various combinations of INRT, INFT and X. From this information macro model generator 34 creates a macro model 32 for the subtree. Macro model 32 is suitably implemented, for example, as a lookup table for providing values of MMAXRD, MMINRD, MMAXFD and MMINRD as functions of various combinations of INRT, INFT and X.

Thereafter, whenever a CTS tool analyzes a clock tree 14 to determine maximum and minimum rising and falling edge path delays between root 23 and any sink inside subtree 24, it first analyzes the subtree to determine INRT, INFT, INRD and INFD at subtree root 26, next calculates X=INRD–INFD, and then applies the values of INRT, INFT, and X as inputs to the subtree macro model 32. Macro model 32 then returns appropriate values of MMAXRD, MMINRD, MMAXFD and MMINRD for those particular values of INRT, INFT and X. The CTS tool then uses those values, together with values of INRD and INFD at subtree root 26 to determine the total maximum and minimum rising and falling edge delays between root 23 and the sinks served by subtree 24.

Figure 8:
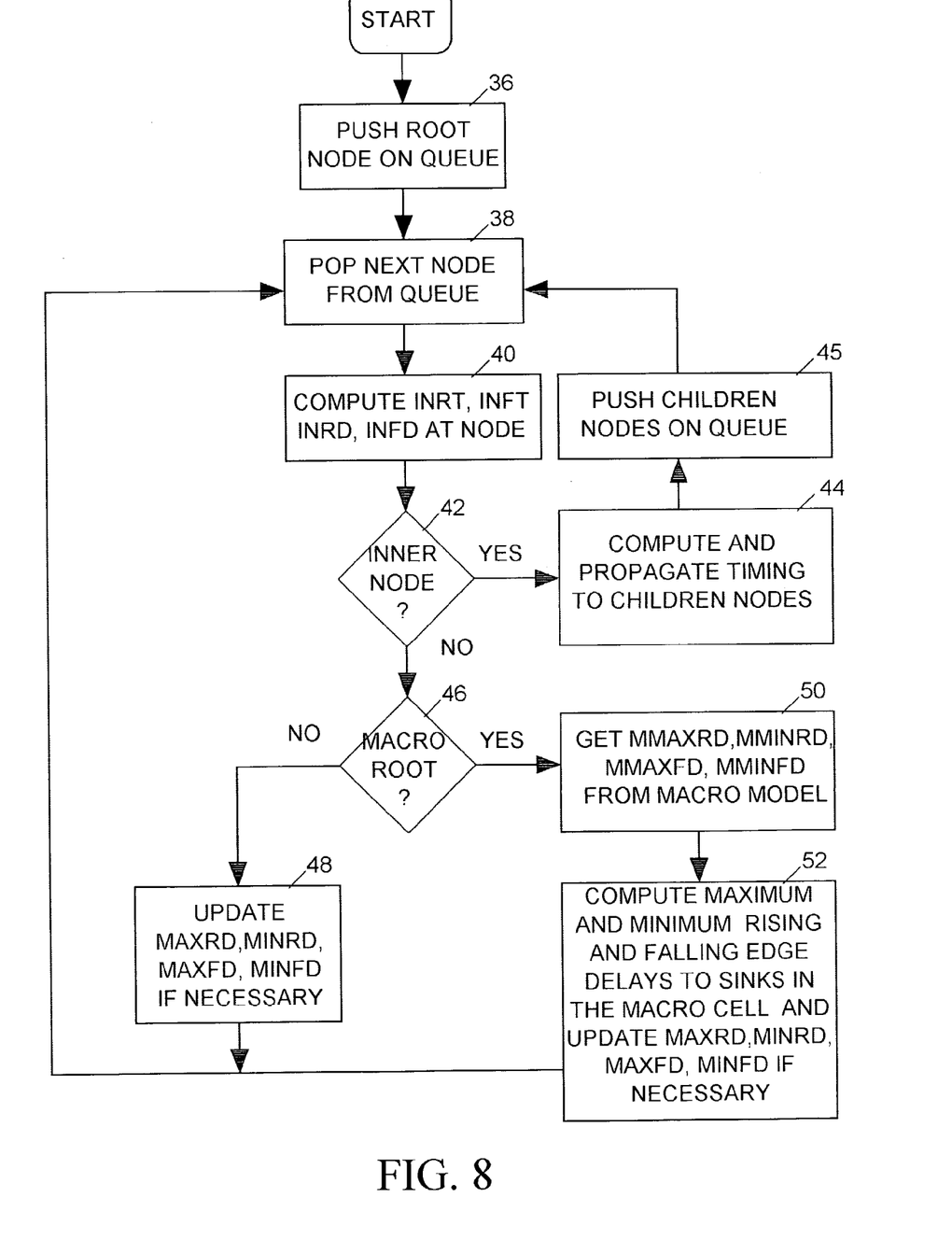
FIG. 8 is a flow chart illustrating a method in accordance with the invention for determining maximum and minimum clock signal edge delays from a root of a clock tree to the sinks connected to it.

FIG. 8 is a flow chart illustrating an algorithm a clock tree synthesis tool in accordance with the invention may employ to analyze a clock tree design in which one or more subtrees are represented by macro models to determine the rising and falling clock signal edge delays and transition times INRD, INFD, INRT and INFT at each node of the clock tree not within a macro-cell, and to determine the maximum and minimum rising and falling edge delays MMAXRD, MMINRD, MMAXFD, MMINFD between the root of the clock tree and all sinks receiving a clock signal via the clock tree.

The CTS tool analyzes the clock tree on a node-by-node basis in the order in which the clock signal traverses the clock tree starting with the root 23 of the tree. The CTS tool stores references to the nodes of the tree in a queue in the order in which the nodes are to be analyzed. The queue is initially empty, but starting at step 36, the CTS tool pushes a reference to the clock tree's root onto the queue. The CTS tool then pops the longest stored reference off of the queue (step 38) and the computes the values of INRT, INFT, INRD, and INFD for the clock signal at that node in a well-known manner (step 40). At the root of the clock tree, the rising and falling edge path delays INRD and INFD will both be 0. The values for clock signal rising and falling edge transition times INRT and INFT at root 23 are determined from specifications for clock signal that is to be supplied to the IC. When the node being processed is an "inner node" of the clock tree, a node that is not the input of a sink and not a root of macro-cell's subtree (step 42), the CTS tool determines that node's children nodes, computes the timing at the output of he current node, and propagates that timing into the inputs of its children nodes (step 44). The CTS tool then pushes references to those children nodes onto the queue (step 45). The children node of a clock tree node are the nodes immediately downstream of that node. A node at which a clock tree branches may have several children nodes.

The CTS tool then pops the next longest stored node off the queue (step 38) and computes the values of INRT, INFT, INRD and INFD at that node (step 40). When that node is not an inner node (step 42) and is not the root of a subtree within a macro-cell (step 46), then the node is the input of a sink, and in such case (step 48), the CTS tool determines whether the values of either INRD or INFD for that node are the largest or smallest values thus far computed for any node of the clock tree and, if so alters values of one or more of a set of variables MAXRD, MINRD, MAXFD, MINFD accordingly.

The CTS tool uses variable MAXRD to keep track of the maximum rising edge delay for any node thus far computed. MAXRD initially has value 0, but whenever the CTS tool computes INRD for a node at the input of a sink, it compares that value of INRD to the current value of MAXRD at step 48 and sets MAXRD equal to INRD whenever INRD>MAXRD. Variable MINRD keeps track of the minimum rising edge delay for any node thus far computed. MINRD is initially set to its maximum value, but whenever the CTS tool computes INRD for a node at the input of a sink it compares that value of INRD to the current value of MINRD at step 48 and sets MINRD equal to INRD when INRD<MAXRD at step 48. Similarly the CTS tool uses MAXFD and MINFD to keep track of the maximum and minimum falling edge delays for any node thus far computed. When CTS tool computes INFD for any node, it compares that value of INRD to MAXFD and MINFD at step 48 and sets MAXFD equal to INFD when INFD>MAXFD and sets MINFD equal to INFD when INFD<MINFD.

When the node for which INRT, INFT, INRD and INFD is computed at step 40 is the root of a subtree within a macro-cell (step 46) the CTS tool supplies values of INRT, INFT and X=INRD−INFD as input to the macro model for the subtree, thereby to obtain values of MMAXRD, MMINRD, MMAXFD and MMINFD for that subtree (step 50). Based on this information, and on the values of INFD and INRD computed for that node at step 40, the CTS tool computes maximum and minimum rising and falling edge delays to the sinks within the macro-cell (step 52). If these delays are the largest or smallest rising or falling edge delays thus far computed, values of MAXRD, MINRD, MAXFD and/or MINFD are updated accordingly at step 52. After step 48 or 52, the CTS tool returns to step 38 to pop a next clock tree node from the queue.

The process depicted in FIG. 8 continues to loop through step 38-52 until at step 38, the CTS tool finds that the queue is empty. At that point the CTS tool will have computed INRT, INFT, INRD and INFD for every node of the clock tree outside a macro-cell, and will have computed values of MAXRD, MINRD, MAXFD and MINFD that indicate the maximum and minimum rising and falling edge delays between the clock tree root and a node at the input of sink served by that clock tree whether the sink resides inside or outside the macro-cell. The CTS tool can then determine from the values of MAXRD, MINRD, MAXFD and MINFD whether the clock tree exhibits a clock signal skew that is within acceptable limits. If the skew is unacceptable, the CTS tool can adjust path delays by inserting buffers or inverter (34) into clock tree branches or adjusting sizes or positions of buffers or inverters already residing in tree branches. The INRD and INFD values computed for each node of the tree help the CTS tool to determine where and how to make those buffer insertions and adjustments.

Figures 9, 10:
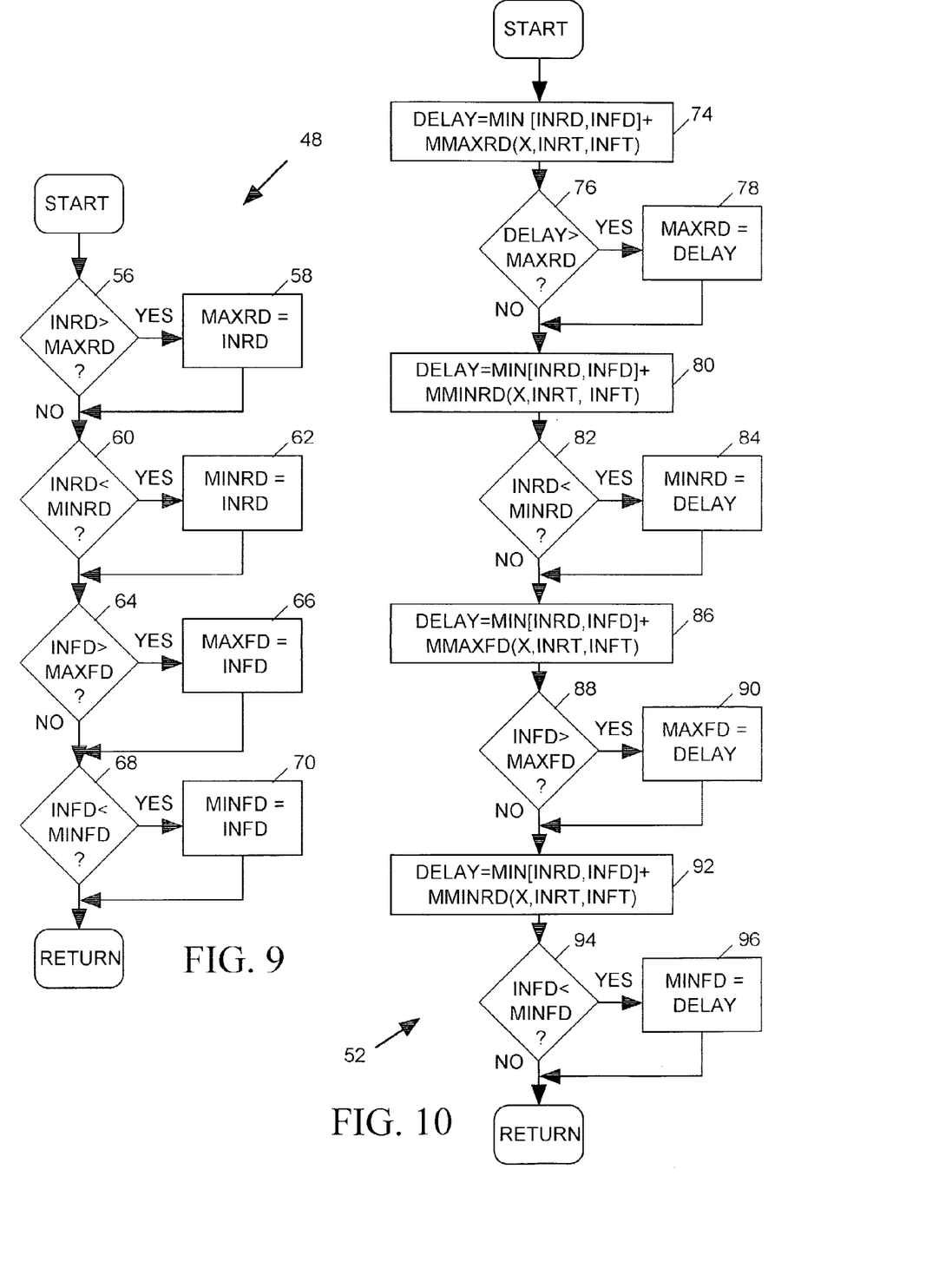
FIG. 9 is a flow chart depicting step 48 of FIG. 8 in more detail.
FIG. 10 is a flow chart depicting step 52 of FIG. 8 in more detail.

FIG. 9 is a flow chart illustrating step 48 of FIG. 8 in more detail. At the point at which step 48 is executed, values of clock rising edge delay INRD and falling edge delay INFD will have been computed for a node under consideration at the input of a sink. When INRD for that node is greater than the current value of MAXRD (step 56), then MAXRD is set equal to INRD (step 58). When INRD for that node is less than the current value of MINRD (step 60), then MINRD is set equal to INRD (step 62). When INFD for that node is greater than the current value of MAXFD (step 64), then MAXRD is set equal to INRD (step 66). When INFD for that node is less than the current value of MINRD (step 68), then MINRD is set equal to INRD (step 70).

FIG. 10 is a flow chart illustrating step 52 of FIG. 8 in more detail. Step 52 is carried out when the node currently under consideration is the root of a subtree for a macro-cell and the macro model for that subtree has been consulted at step 50 to obtain values of maximum and minimum rising and falling edge delay MMAXRD, MMINRD, MMAXFD and MMINFD for the sinks within the macro-cell that are served by that subtree. Referring to FIG. 10, at step 74 a value DELAY is computed as the sum of the minimum of INRD and INFD at the subtree root and the maximum rising edge delay MMAXRD(X, INRT, INFT) between the root 26 of the subtree and any sink receiving the clock signal via that subtree. The computed value of DELAY represents the maximum rising edge delay between the root 23 of the clock tree and any sink served by the subtree, and if DELAY is greater than the current value of MAXRD (step 76), then MAXRD is set equal to DELAY (step 78).

At step 80 the value DELAY is computed as the sum of the minimum of INRD and INFD at the subtree root and the minimum rising edge delay MINRD(X, INRT, INFT) between the root 26 of the subtree and any sink receiving the clock signal via that subtree. This computed value of DELAY represents the minimum rising edge delay between the root 23 of the clock tree and any sink served by the subtree, and if DELAY is greater than the current value of MINRD (step 82), then MINRD is set equal to DELAY (step 84).

At step 86 the value DELAY is computed as the sum of the minimum of INRD and INFD at the subtree root and the maximum falling edge delay MAXFD(X, INRT, INFT) between the root 26 of the subtree and any sink receiving the clock signal via that subtree. This computed value of DELAY represents the maximum falling edge delay between the root 23 of the clock tree and any sink served by the subtree, and if DELAY is greater than the current value of MINRD (step 88), then MAXRD is set equal to DELAY (step 90).

At step 92 the value of DELAY is computed as the sum of the minimum of INRD and INFD at the subtree root and the minimum falling edge delay MINFD(X, INRT, INFT) between the root 26 of the subtree and any sink receiving the clock signal via that subtree. This computed value of DELAY represents the minimum falling edge delay between the root 23 of the clock tree and any sink served by the subtree, and if DELAY is greater than the current value of MINFD (step 94), then MINfD is set equal to DELAY (step 96).

Thus in accordance with the invention a macro model for a clock tree subtree estimates maximum and minimum rising and falling edge delays from its root to the sinks that it serves as a function of not only the rising and falling edge transition times INRT and INFD of the clock signal at the root of the subtree, but also as a function of the difference X=INRD−INFD between clock signal rising and falling edge delays at the subtree root. Since the clock signal's duty cycle at the root of the subtree can have a substantial influence on the rising and falling edge path delays through the subtree, a macro model in accordance with the invention, which takes not only clock signal rising and falling edge transition time INRT and INFT but also the clock signal's duty cycle into account when modeling path delays through the subtree, is more accurate than prior art macro models that take only INRT and INFT into account.

In the preferred embodiment of the invention, the macro model uses X at the root of the subtree as an independent variable since the clock signal's duty cycle at the subtree root is a monotonic function of X. However since the clock signal duty cycle is a function of the relative magnitudes of INFD and INRD, in other embodiments of the invention, INFD and INRD may be combined in other ways to provide a suitable independent variable X for the macro model, such as for example

X=INFD−INRD,

X=INFD/INRD,

X=INRD/INFD,

X=INRD/(INRD+INFD), or

X=INFD/(INRD+INFD)

The clock signal duty cycle is a monotonic function of any of these values of X.

The foregoing specification and the drawings depict an exemplary, preferred embodiment of the best mode of practicing the invention, and elements or steps of the depicted best mode exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A method of processing a layout design for an integrated circuit (IC), wherein the IC comprises a clock tree for delivering a clock signal from a first IC node to a first plurality of sinks within the IC and to a second IC node forming a root of a subtree of the clock tree for delivering the clock signal from the second IC node to a second plurality of sinks within the IC, the method comprising the steps of:
   a. providing a model of the subtree for generating estimates of maximum and minimum delays of rising and falling edges of the clock signal from the second IC node to any of the second plurality of sinks, wherein the estimates are functions of a measure of relative magnitudes of path delays of rising and falling edges of the clock signal from the first IC node to the second IC node, when said measure is supplied as input to the model;
   b. processing the layout designs, thereby generating estimates of magnitudes of path delays of rising and falling edge of the clock signal between the first IC node and the second IC node and determining therefrom the measure of the relative magnitudes of the path delays of the rising and falling edges of the clock signal from the first node to the second IC node; and
   c. supplying the measure determined at step b as input to the model such that the model generates the estimates of maximum and minimum delays of rising and falling edges of the clock signal from the second IC node to any of the second plurality of sinks.

2. The method in accordance with claim 1 wherein the measure determined at step b is proportional to a difference between the magnitudes of the rising and falling edge delays estimated at step b.

3. The method in accordance with claim 1 wherein the measure determined at step b is proportional to a ratio of the magnitudes of the rising and falling edge delays estimated at step b.

4. A method of processing a layout design for an integrated circuit (IC), wherein the IC comprises a clock tree for delivering a clock signal from a first IC node to a first plurality of sinks within the IC and to a second IC node forming a root of a subtree of the clock tree for delivering the clock signal from the second IC node to a second plurality of sinks within the IC, the method comprising the steps of:
   a. providing a model of the subtree for generating estimates of maximum and minimum delays of rising and falling edges of the clock signal from the second IC node to any of the second plurality of sinks, wherein the estimates are functions of a measure of relative magnitudes of delays of rising and falling edges of the clock signal from the first IC node to the second IC node, when said measure is supplied as input to the model;
   b. processing the layout design, thereby generating estimates of magnitudes of delays of rising and falling edge of the clock signal between the first IC node and the second IC node and determining therefrom the measure of the relative magnitudes of the delays of the rising and falling edges of the clock signal from the first node to the second IC node;
   c. supplying the measure determined at step b as input to the model such that the model generates the estimates of maximum and minimum delays of rising and falling edges of the clock signal from the second IC node to any of the second plurality of sinks; and,
   d. determining maximum and minimum rising and falling edge delays of the clock signal from the first node to any of the second plurality of sinks as functions of the estimates of magnitudes of delays of rising and falling edge of the clock signal between the first IC node and the second IC node generated at step b, and of the estimates of maximum and minimum delays of rising and falling edges of the clock signal from the second IC node to any of the second plurality of sinks generated by the model at step c.

5. Computer readable media, which when read and executed by a computer, causes the computer to carry out a method of processing a layout design for an integrated circuit (IC), the IC comprising a clock tree for delivering a clock signal from a first IC node of the IC to a first plurality of sinks within the IC and to a second IC node of the IC forming a root of a subtree of the clock tree that delivers the clock signal from the second IC node to a second plurality of sinks wherein the method comprises the steps of:
   a. processing the layout design, thereby generating estimates of magnitudes of transition times of the rising and falling edges of the clock signal at the second IC node, estimates of magnitudes of path delays of rising and falling edges of the clock signal between the first IC node and the second IC node, and a measure of the relative magnitudes of the path delays of the rising and falling edges of the clock signal from the first IC node to the second IC node; and
   b. supplying the estimates of the magnitudes of the transition times and the measure of the relative magnitudes of the path delays of the rising and falling edges of the clock signal between the first IC node and the second IC node generated at step a as inputs to a model of the subtree which generates estimates of maximum and minimum delays of rising and falling edges of the clock signal from the second IC node to any of the second plurality of sinks as functions of said inputs.

6. The computer-readable media in accordance with claim 5 wherein the measure generated at step a is proportional to a difference between the determined magnitudes of the path delays of the rising and falling edges of the clock signal from the first IC node to the second IC node.

7. The computer-readable media in accordance with claim 5 wherein the measure generated at step a is proportional to a ratio of the determined magnitudes of the path delays of the rising and falling edges of the clock signal from the first IC node to the second IC node.

8. Computer readable media, when read and executed by a computer, causes the computer to carry out a method of processing a layout design for an integrated circuit (IC), the IC comprising a clock tree for delivering a clock signal from a first IC node of the IC to a first plurality of sinks within the IC and to a second IC node of the IC forming a root of a subtree of the clock tree that delivers the clock signal from the second IC node to a second plurality of sinks wherein the method further comprises the step of:
   a. processing the layout design, thereby generating estimates of magnitudes of transition times of the rising and falling edges of the clock signal at the second IC node, estimates of magnitudes of delays of rising and falling edges of the clock signal between the first IC node and the second IC node, and a measure of the relative magnitudes of the delays of the rising and falling edges of the clock signal from the first IC node to the second IC node;
   b. supplying the estimates of the magnitudes of the transition times and the measure of the relative magnitudes of the delays of the rising and falling edges of the clock signal between the first IC node and the second IC node generated at step a as inputs to a model of the subtree which generates estimates of maximum and minimum delays of rising and falling edges of the clock signal from the second IC node to any of the second plurality of sinks as functions of said inputs; and,
   c. determining a maximum rising edge delay of the clock signal from the first IC node to any of the second plurality of sinks as a first function of the estimates of magnitudes of delays of rising and falling edges of the clock signal between the first IC node and the second IC node generated at step a, and of the estimates of maximum and minimum delays of rising and falling edges of the clock signal from the second IC node to any of the second plurality of sinks generated at step b.

9. A method of generating and analyzing an integrated circuit (IC) design having a clock tree including at least one subtree for delivering a clock signal from a root of the clock tree to a plurality of sinks, the method comprising the steps of:
   a. generating a macro-cell comprising a description of a set of clocked devices (sinks) and a clock tree subtree for delivering a clock signal from a root of the subtree to the sinks; and
   b. generating and operating a model of the macro-cell's subtree to determine maximum and minimum rising and falling clock signal edge path delays through the subtree between the root of the subtree and the sinks of the macro-cell as functions of the clock signal's rising and falling edge transition times at the root of the clock tree, and of a relative amount of path delays that the clock signal's rising and falling edges experience from the root of the clock tree to the root of the subtree.

10. The method in accordance with claim 9 further comprising the steps of:
   c. generating the IC design, wherein the IC design comprises an instance of the macro-cell and a description of a clock tree for delivering the clock signal from a root of the clock tree to the root of the clock tree subtree described by the instance of the macro-cell; and
   d. performing an analysis of the IC design to determine maximum and minimum clock signal edge path delays through the clock tree it describes, wherein the analysis includes using the model of the macro-cell's subtree to determine the clock signal's maximum and minimum rising and falling edge delays through the subtree described by the instance.

11. The method in accordance with claim 9 wherein the relationship between the delays of the clock signal's rising and falling edges is proportional to a difference between the delays of the clock signal's rising and falling edges.

12. The method in accordance with claim 9 wherein the relationship between the delays of the clock signal's rising and falling edges is proportional to a ratio of the delays of the clock signal's rising and falling edges.

13. A method of generating and analyzing an integrated circuit (IC) design comprising the steps of:
   a. generating a macro-cell comprising a description of a set of clocked devices (sinks) and a clock tree subtree for delivering a clock signal from a root of the subtree to the sinks;
   b. generating a model of the macro-cell's subtree representing maximum and minimum rising and falling clock signal edge path delays through the subtree between the root of the subtree and the sinks of the macro-cell as functions of the clock signal's rising and falling edge transition-times at the root of the clock tree and also as functions of a relationship between delays that the clock signal's rising and falling edges experience relative to one another prior to reaching the root of the subtree;
   c. generating the IC design, wherein the IC design comprises an instance of the macro-cell and a description of a clock tree for delivering the clock signal from a root of the clock tree to the root of the clock tree subtree described by the instance of the macro-cell; and
   d. performing an analysis of the IC design to determine maximum and minimum clock signal edge path delays through the clock tree it describes, wherein the analysis includes using the model of the macro-cell's subtree to determine the clock signal's maximum and minimum rising and falling edge delays through the subtree described by the instance;
   wherein step d comprising the substeps of:
      d1. analyzing the IC design to determine the clock signal's rising and falling edge transition times at the root of the subtree,
      d2. analyzing the IC design to determine delays of the clock signal's the rising and falling edges between the clock tree's root and the subtree's root, and
      d3. using the model of the macro-cell's subtree to determine the clock signal's maximum and minimum rising and falling edge delays through the subtree as functions of the rising and falling edge transition times determined at step d1 and of a relationship between the delays of the clock signal's rising and falling edges determined at step d2.

14. The method in accordance with claim 13 wherein the relationship between the delays of the clock signal's rising and falling edges is proportional to a difference between the delays of the clock signal's rising and falling edges.

15. The method in accordance with claim 13 wherein the relationship between the delays of the clock signal's rising and falling edges is proportional to a ratio of the clock signal's rising and falling edges.

16. An apparatus for processing a layout design for an integrated circuit (IC), wherein the IC comprises a clock tree for delivering a clock signal from a first IC node to a first plurality of sinks within the IC and to a second IC node forming a root of a subtree of the clock tree for delivering the clock signal from the second IC node to a second plurality of sinks within the IC, the apparatus comprising:

means for providing a model of the subtree for generating estimates of maximum and minimum delays of rising and falling edges of the clock signal from the second IC node to any of the second plurality of sinks, wherein the estimates are functions of a measure of relative magnitudes of path delays of rising and falling edges of the clock signal from the first IC node to the second IC node, when said measure is supplied as input to the model;

means for processing the layout design to generate estimates of magnitudes of path delays of rising and falling edges of the clock signal between the first IC node and the second IC node and determining therefrom the measure of the relative magnitudes of the path delays of the rising and falling edges of the clock signal from the first node to the second IC node; and means for supplying the determined measure as input to the model such that the model generates the estimates of maximum and minimum delays of rising and falling edges of the clock signal from the second IC node to any of the second plurality of sinks.

17. The apparatus in accordance with claim 16 wherein the determined measure is proportional to a difference between the magnitudes of the estimated rising and falling edge delays.

18. The apparatus in accordance with claim 16 wherein the determined measure is proportional to a ratio of the magnitudes of the estimated rising and falling edge delays.

19. An apparatus for processing a layout design for an integrated circuit (IC), wherein the IC comprises a clock tree for delivering a clock signal from a first IC node to a first plurality of sinks within the IC and to a second IC node forming a root of a subtree of the clock tree for delivering the clock signal from the second IC node to a second plurality of sinks within the IC, the apparatus comprising:

means for providing a model of the subtree for generating estimates of maximum and minimum delays of rising and falling edges of the clock signal from the second IC node to any of the second plurality of sinks, wherein the estimates are functions of a measure of relative magnitudes of delays of rising and falling edges of the clock signal from the first IC node to the second IC node, when said measure is supplied as input to the model;

means for processing the layout design to generate estimates of magnitudes of delays of rising and falling edges of the clock signal between the first IC node and the second IC node and to determine therefrom the measure of the relative magnitudes of the delays of the rising and falling edges of the clock signal from the first node to the second IC node; and means for supplying the determined measure as input to the model such that the model generates the estimates of maximum and minimum delays of rising and falling edges of the clock signal from the second IC node to any of the second plurality of sinks; and, means for determining maximum and minimum rising and falling edge delays of the clock signal from the first node to any of the second plurality of sinks as functions of the estimates of magnitudes of delays of the rising and falling edges of the clock signal between the first IC node and the second IC node, and of the estimates of maximum and minimum delays of rising and falling edges of the clock signal from the second IC node to any of the second plurality of sinks generated by the model.

\* \* \* \* \*